(12) United States Patent
Tan

(10) Patent No.: US 8,374,231 B2
(45) Date of Patent: Feb. 12, 2013

(54) EQUALIZATION SIMULATOR WITH TRAINING SEQUENCE DETECTION FOR AN OSCILLOSCOPE

(75) Inventor: Kan Tan, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 893 days.

(21) Appl. No.: 12/423,604

(22) Filed: Apr. 14, 2009

(65) Prior Publication Data

US 2010/0085362 A1    Apr. 8, 2010

Related U.S. Application Data

(60) Provisional application No. 61/049,298, filed on Apr. 30, 2008.

(51) Int. Cl.
 *H03H 7/30* (2006.01)
(52) U.S. Cl. ...................................... 375/231
(58) Field of Classification Search .............. 375/231
See application file for complete search history.

(56) References Cited

U.S. PATENT DOCUMENTS

| | | | |
|---|---|---|---|
| 7,408,363 B2 * | 8/2008 | Tan et al. ............... | 324/638 |
| 7,460,983 B2 * | 12/2008 | Pickerd et al. ............ | 702/190 |
| 2003/0072363 A1 | 4/2003 | McDonald et al. | |
| 2006/0176984 A1 | 8/2006 | Lee et al. | |
| 2006/0182231 A1 * | 8/2006 | Tan et al. ................ | 379/30 |
| 2007/0201544 A1 | 8/2007 | Zhu | |
| 2007/0276614 A1 * | 11/2007 | Tan et al. ................ | 702/55 |
| 2007/0276622 A1 * | 11/2007 | Pickerd et al. ............ | 702/106 |
| 2008/0008280 A1 | 1/2008 | Zhu | |
| 2008/0043884 A1 | 2/2008 | Zhu | |
| 2008/0049824 A1 | 2/2008 | Yang | |
| 2008/0049871 A1 | 2/2008 | Yang | |
| 2008/0063043 A1 | 3/2008 | Xia | |
| 2008/0181292 A1 | 7/2008 | Yang | |
| 2008/0260014 A1 | 10/2008 | Yang | |

FOREIGN PATENT DOCUMENTS

WO         2005101652 A1    10/2005

OTHER PUBLICATIONS

Propstra, SAS 6G Equalization Measurement proposal (07-467r0) T10/07-467r0, 2007.*
Agili, "de-embedding techniques in signal integrity: a comparison study", 2005.*
Application Note 1364-1, Agilent Technologies, "De-embedding and Embedding S-Parameter Networks Using a Vector Network Analyzer," May 30, 2004, pp. 1-24.*
Application Note, Anritsu, Scorpion "Embedding/De-embedding," May 2002, pp. 1-16.*
Bari, "SAS-2 Delivered Amplitude Calibration for Receiver Testing", Nov. 5, 2007 T10/07-492r0.*

* cited by examiner

*Primary Examiner* — Juan A Torres
(74) *Attorney, Agent, or Firm* — William K. Bucher

(57) ABSTRACT

An equalization simulator with training sequence detection uses an oscilloscope to acquire digital samples of an analog waveform signal from a serial data link to produce a digitized waveform record. The equalization simulator has training sequence detection receiving the digitized waveform record and generates a training sequence, an equalization adapter receiving the digitized waveform record and the training sequence and generating equalizer taps, and an equalizer receiving the equalizer taps and the digitized waveform record and generating an equalized digitized waveform record.

10 Claims, 8 Drawing Sheets

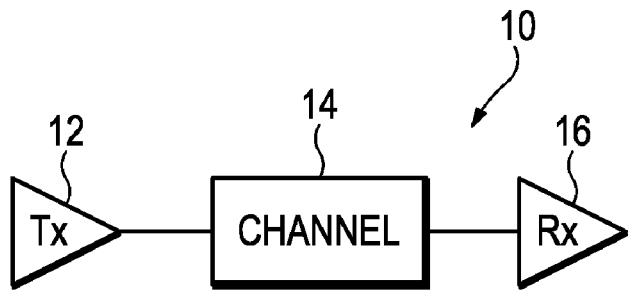
Figure 1
(PRIOR ART)
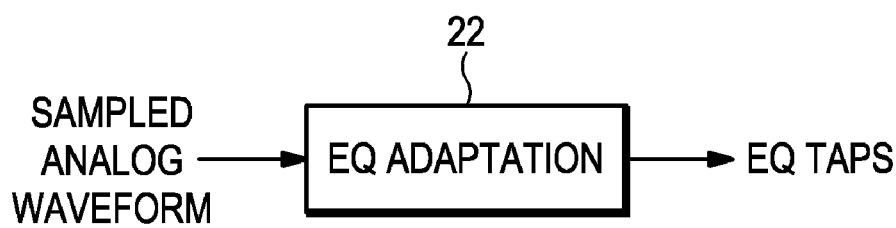
Figure 2
(PRIOR ART)
Figure 3
(PRIOR ART)

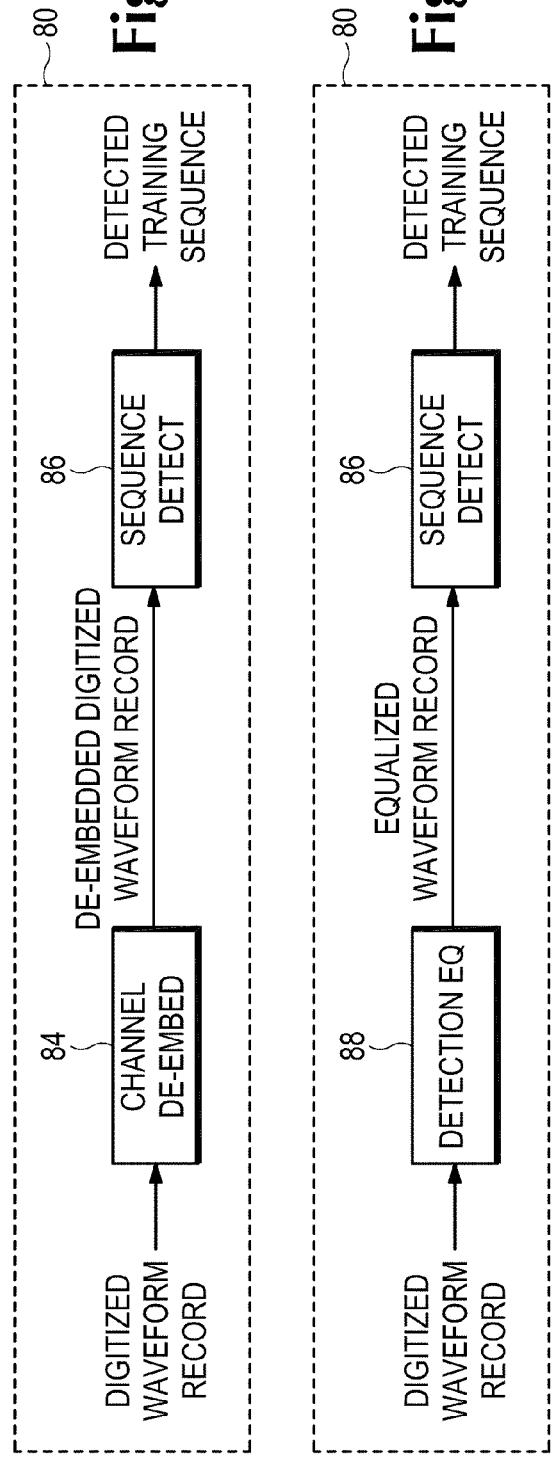
Figure 8
Figure 9
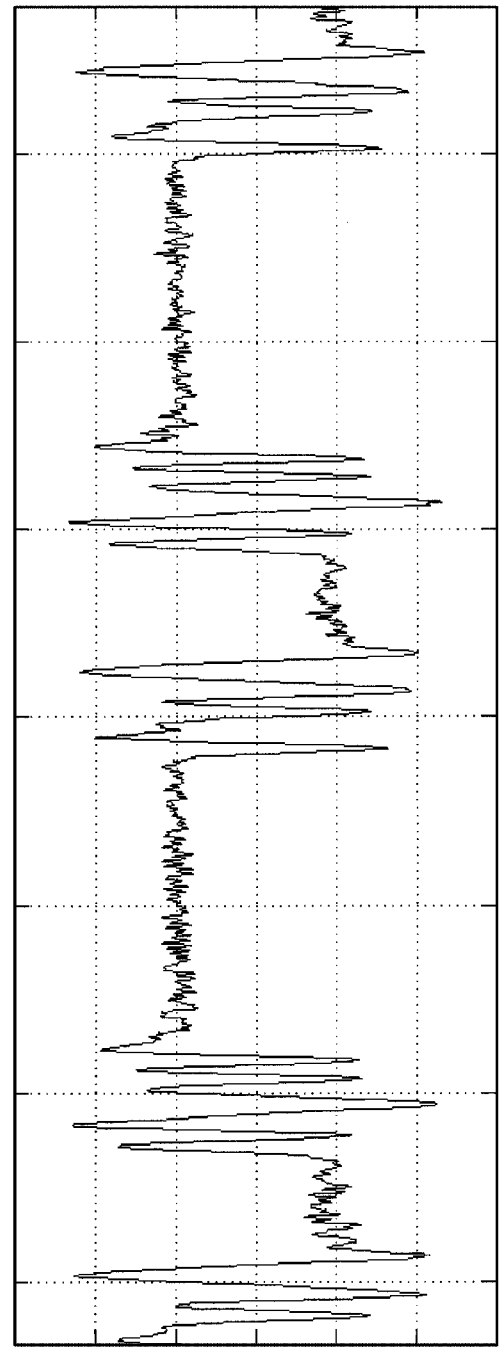
Figure 10

EQUALIZATION SIMULATOR WITH TRAINING SEQUENCE DETECTION FOR AN OSCILLOSCOPE

BACKGROUND OF THE INVENTION

High speed serial data link systems 10 are composed of a transmitter 12, a channel 14 and a receiver 16 as shown in FIG. 1. As serial data speed reaches 6 Gb/s and beyond, equalization techniques become necessary to maintain system performance in the presence of channel loss, reflection, cross talk, noise and other factors that degrade the system performance. The system performance can be measured in various ways including bit error rate, eye opening, and jitter measurements. Industry standards start defining measurements based on equalization measurement or simulation, such as methods proposed to SAS-2 6 G (Serial Attached SCSI (Small Computer System Interface)-2 6 Gigabits/sec) standard committee.

One equalization or simulation method is based on knowing a training sequence, and having the averaged sampled analog data pattern waveform to equalize. An equalization adaptation algorithm 20 uses both inputs to optimize equalizer taps as depicted in FIG. 2. However, this method doesn't explicitly take into account the signal components that are not correlated to data pattern, such as periodic and random jitter/noise for equalizer tap optimization.

Another solution for equalization simulation on oscilloscopes uses only the sampled analog waveforms for equalizer adaptation, as shown in FIG. 3. When the waveforms have very severe Inter-Symbol Interference, ISI, and large noise, the blind equalizer adaptation approach 22 would fail since there is no guarantee that the taps are optimized correctly. The bit sequence could be classified incorrectly.

The real-time oscilloscopes capture signals without aliasing, so all the frequency dependent information is preserved. When an equalizer adaptation algorithm uses the real-time samples directly, the equalizer taps are optimized in the sense that all the frequency dependent information has been taken into account. For example, when the sinusoidal noise has energy concentrated at different frequencies, the optimized taps will have different values so that the optimal system performance is achieved accordingly to the specific sinusoidal noise distribution.

Real-time oscilloscopes have the flexibility to capture any waveforms, even when triggers are difficult or impossible to obtain precisely. Without any trigger, a real-time oscilloscope can take a long record single shot acquisition to record the waveform, and then process the waveform with equalization simulation.

SUMMARY OF THE INVENTION

Accordingly, the present invention is an equalization simulator with training sequence detection for use in an oscilloscope generating a digitized waveform record from acquiring samples of an analog waveform signal from a serial data link. The equalization simulator has a training sequence detector receiving the digitized waveform record and generating a training sequence, an equalization adapter receiving the digitized waveform record and the training sequence and generating equalizer taps, and an equalizer receiving the equalizer taps and the digitized waveform record and generating an equalized digitized waveform record of the analog waveform signal.

The training sequence detector has an input signal processor receiving the digitized waveform and producing a processed digitized waveform record having channel effects of the serial data link removed. The input signal processor may be a de-embed filter generated using S- or T-Parameters representing channel characteristics of the serial data link. The de-embed filter receives the digitized waveform record and generates a de-embedded processed digitized waveform record. The input signal processor may also be a detection equalizer receiving the digitized waveform record and generating an equalized processed digitized waveform record. The output of the input signal processor is applied to the sequence detector.

The equalization adapter has a means for recovering a clock from the digitized waveform record having a clock rate equal to the bit rate of the analog waveform signal and a re-sampler receiving the digitized waveform record and the recovered clock and generating a re-sampled digitized waveform record using the recovered clock signal according the bit rate of the analog waveform signal. The equalization adapter also has means for aligning the re-sampled digitized waveform record with the training sequence to generate an training sequence aligned with the re-sampled digitized waveform record, and means for generating equalizer taps using the re-sampled digitized waveform record and the aligned training sequence.

The method of equalization simulation with a training sequence detector using an oscilloscope starts with acquiring samples of an analog waveform signal for a digitized waveform record using the oscilloscope. A training sequence is detected from the digitized waveform record. A clock signal is recovered from the digitized waveform record having a clock rate equal to the bit rate of the analog waveform signal and the digitized waveform record is re-sampled according the bit rate of the analog waveform signal using the recovered clock signal. De-emphasis is applied at the center of the bits in the re-sampled digitized waveform record and the detected training sequence is aligned with the de-emphasized re-sampled digitized waveform record. Equalizer taps are generated using the re-sampled digitized waveform record and the aligned training sequence. The generated equalizer taps are used in an equalizer to equalizing the digitized waveform record.

The training sequence detecting step includes at least one of the steps of channel de-embedding, pre-equalization, decreasing the bit rate of the analog waveform signal and acquiring samples of the analog waveform signal at the transmitter end of the channel for a digitized waveform record. A channel de-embed filter is generated as a function of the channel characteristics, and a de-embedded digitized waveform record is generated by applying the digitized waveform record to the de-embed filter. A multi-tap equalizer generates an equalized digitized waveform record using the digitized waveform record as an input. The de-embedded or equalized digitized waveform record is an applied to the sequence detector for detecting the training sequence. The training sequence detecting step may include the steps of decreasing the bit rate of the analog waveform signal and acquiring samples of the decreased bit rate analog waveform signal using the oscilloscope for detecting the training sequence. The bit rate of the analog waveform signal is increased and samples of the increased bit rate analog waveform signal are acquired using the oscilloscope to generate another digitized waveform record for recovering the clock signal and re-sampling the other digitized waveform record. The training sequence detecting step may include the steps of connecting a measurement probe at a transmitter end of a channel and acquiring samples of the analog waveform signal at the transmitter end of the channel using the oscilloscope for detecting the training sequence. The measurement probe is connected at a receiver end of the channel, and samples are acquired of the analog waveform signal at the receiver end of the channel using the oscilloscope to generate another digitized waveform record for recovering the clock signal and re-sampling the other digitized waveform record.

The step of applying de-emphasis on the center of the bits in the re-sampled digitized waveform record includes the step of defining a de-emphasis value as a function of transition density of the de-emphasized re-sampled digitized waveform record being approximate to the transition density of the detected training sequence and providing a minimal mean square error. The aligning step further has the step of cross correlating the detected training sequence with the de-emphasized re-sampled digitized waveform record to find a peak value to determine the correct alignment.

The objects, advantages and novel features of the present invention are apparent from the following detailed description when read in conjunction with appended claims and attached drawings.

BRIEF DESCRIPTION OF THE DRAWINGS

FIG. 1 is representation of a high speed serial data link system.

FIG. 2 is a representation of one method of equalizer adaptation for generating equalization taps.

FIG. 3 is a representation of another method of equalizer adaptation for generating equalization taps.

FIG. 8 illustrates one method of training sequence detection according to the present invention.

FIG. 9 illustrates another method of training sequence detection according to the present invention.

FIG. 10 shows an equalized waveform using a multi-tap FFE equalizer according to the present invention.

DESCRIPTION OF THE INVENTION

Figure 4:
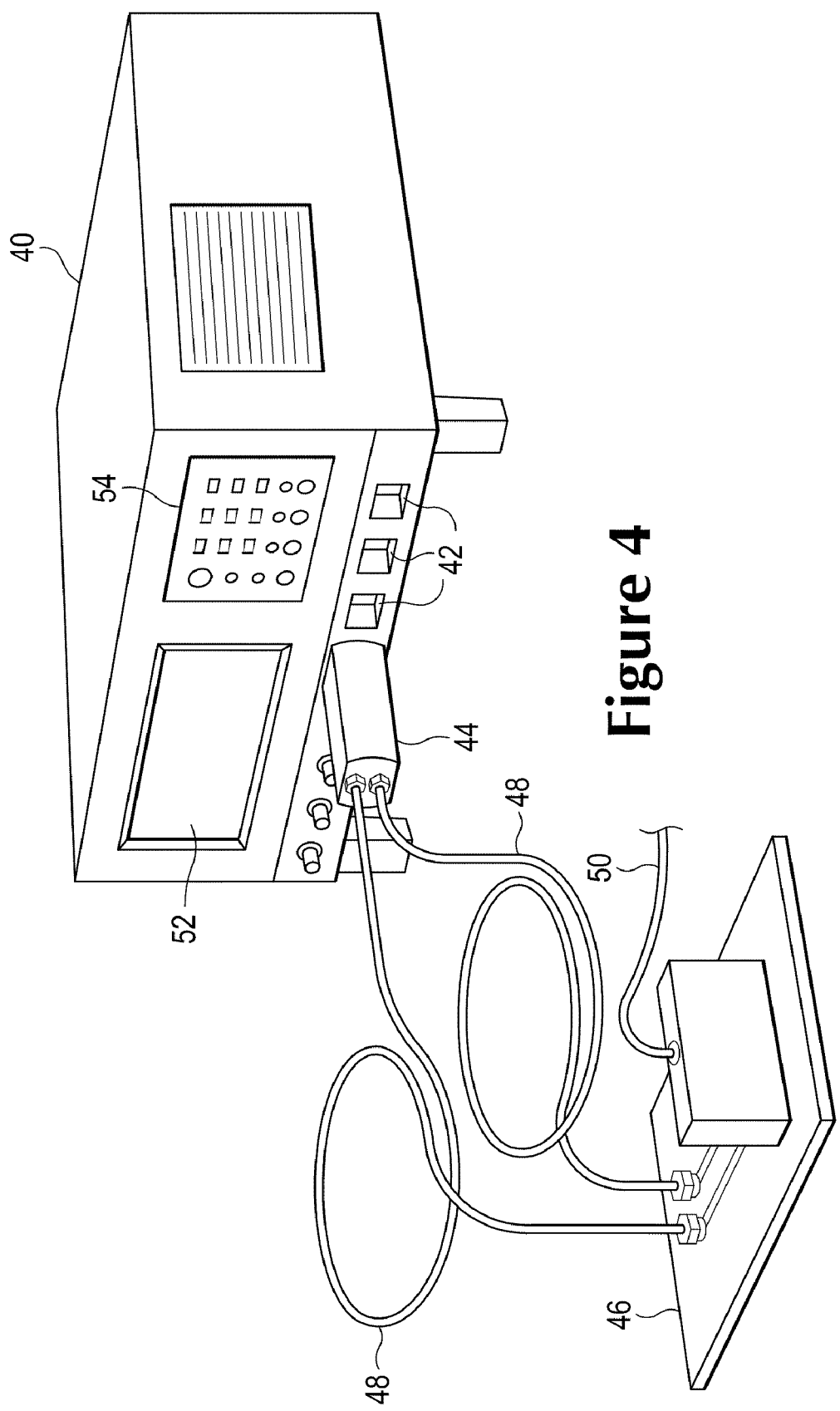
FIG. 4 is a perspective view of an oscilloscope using the training sequence detection for equalizer adaptation according to the present invention.

Referring to FIG. 4, there is shown an oscilloscope 40, such as the DPO71000 Series or TDS71000 Series Real Time Oscilloscope manufactured and sold by Tektronix, Inc. The oscilloscope 40 has multiple accessory interfaces 42 for connecting one or more accessory devices 44 to the oscilloscope, such as the P7313, P7313SMA Differential Probes and the P7500 Series TriMode™ Probes manufactured and sold by Tektronix, Inc. The accessory interface 42 provides voltage power from the oscilloscope 40 to the measurement probe 44 and bi-directional communications between the oscilloscope 40 and the probe 44. The differential measurement probe 44 is coupled via SMA coaxial cables 48, in the case of a P7313SMA probe, to a device under test 46, such as a test fixture coupled to a SAS 6 G cable 50 acting as the channel in a high speed serial data link system. The measurement probe 44 may also consist of a control box connected to the oscilloscope and a probing head coupled by a signal cable to the control box. The P7313 probe is one such measurement probe where the probe head is coupled to the text fixture 46 using probing contacts. The oscilloscope 40 has a display device 52 on which is displayed a graphical user interface and processed signals from a device under test 46. Generally, the measurement test instrument 40 includes front panel controls 54, such as rotatable knobs, push buttons and the like for controlling the settings of the instrument. Alternatively, the front panel controls may be graphically generated and displayed on the display device 52 and controllable by the user.

Figure 5:
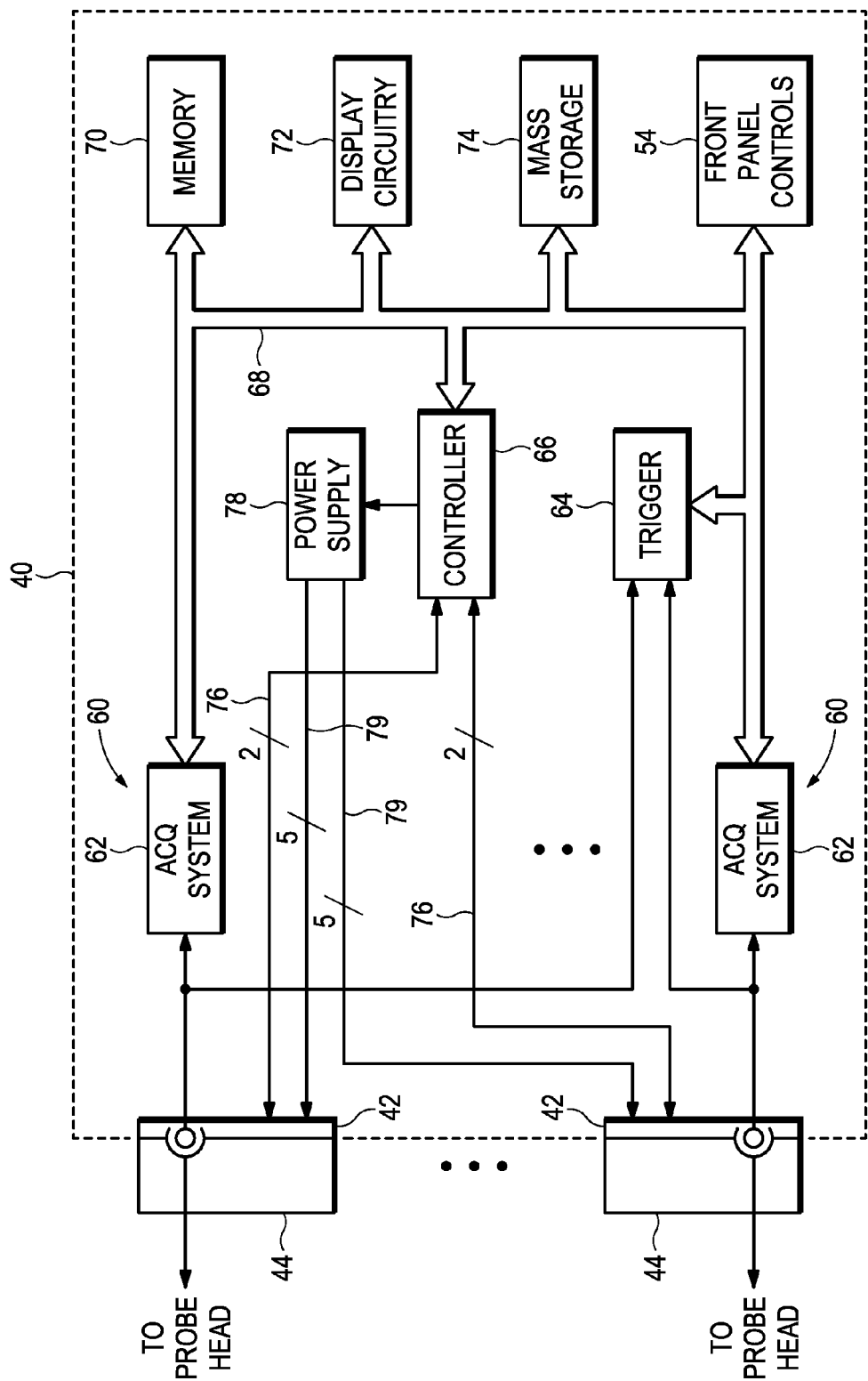
FIG. 5 is a representative block diagram of an oscilloscope using the training sequence detection for equalizer adaptation according to the present invention.

Referring to FIG. 5, there is shown a representative block diagram of a real time oscilloscope 40 using the equalization simulator with training sequence detection according to the present invention. The oscilloscope 40 has separate signal channels 60 coupled to the accessory interfaces 42 with two channels represented in FIG. 5. Each signal channel 60 has a separate acquisition system 62 for receiving an analog waveform signal from the Device Under Test (DUT) 46. Each of the analog waveforms signals coupled to the signal channels 60 is also coupled to trigger circuitry 64 in the oscilloscope 40. The acquisition systems 62 and the trigger circuitry 64 are coupled to a controller 66 via a system bus 68. The system bus 68 is also coupled to a memory 70 that represents RAM, ROM and cache memory with the RAM memory storing volatile data, such as a waveform record of the digitized samples of the analog waveform signal generated by the acquisition systems 62. The system bus 68 is further coupled to display circuitry 72 controlling the display device 52, a mass storage unit or units 74, such as a hard disk drive, CD ROM drive, tape drive, floppy drive or the like that reads from and/or writes to appropriate mass storage media, and the front panel controls 54. It is understood that any number of signal channels 60 may be included in the oscilloscope 40 with each channel having separate acquisitions systems 62.

Program instructions for controlling the oscilloscope 40 and implementing the equalization simulator with training sequence detection may be stored and accessed from the ROM memory 70 or from the mass storage media of the mass storage unit 74. The oscilloscope controller 66 may include one or more microprocessors, such as manufactured and sold by Intel, Corp., Santa Clara, Calif., and controlled using a Windows® Operating System, such a Windows XP®, manufactured and sold by Microsoft, Corp, Redmond, Wash. The oscilloscope controller 66 may also be implemented using multiple controllers and digital signal processing devices. For example, a second controller, such as a Power PC® microprocessor manufactured and sold by Motorola, Inc., Schaumburg, Ill., may be included to control the acquisition and processing of the electrical signals. The display circuitry 72 may include a display controller receiving display instructions from an oscilloscope controller 66 and receiving display data from a digital signal processing device. A bus controller may also be included to monitor the receptacle interface 42 for connected measurement probes 44, and provide communications between the measurement probes 44 and the oscilloscope controller 66 via communications bus 76, such as an I²C bus, IEEE 1494 bus, USB bus or the like, that provides bi-directional communications. A power supply 78 receives control signals from the controller 66 for providing electrical power to the probes 44 via voltage lines 79 and the accessory interfaces 42.

A transmitter 12 in a high speed serial data link system 10 generates an analog waveform signal that is coupled through the channel 14 in the form of a SAS cable to the oscilloscope 40 via the test fixture DUT 46 and measurement probe 44. The analog waveform signal is sampled and digitized by the acquisition system 62 with the digitized analog waveform stored in memory 70 as a waveform record via the system bus 68. The digitized waveform record is processed to generate equalization taps that may be applied to an equalizer in the receiver 16 to offset the channel losses, reflections, cross talk, noise, inter-symbol interference (ISI) and other factors that degrade the system performance.

Figure 6:
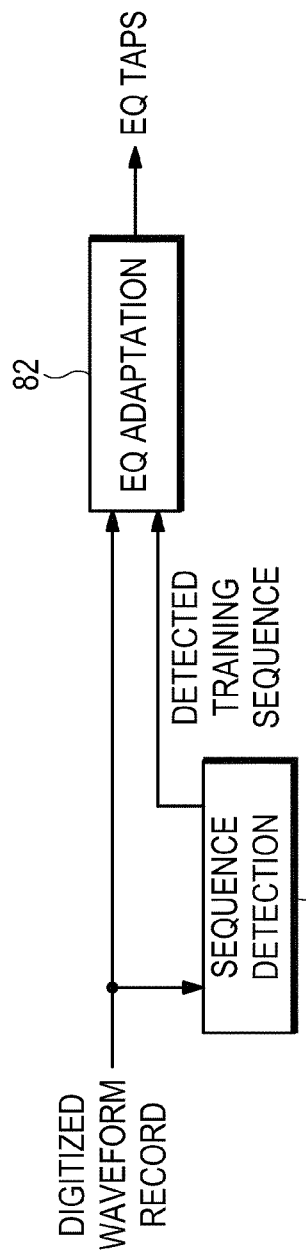
FIG. 6 shows a representation of the broad steps for receiver equalization according to the present invention.

Referring to FIG. 6, there is shown a representation of the equalizer simulation with training sequence detection for receiver equalization, such as receiver 16 defined by the proposed (SAS-2 6 G) (Serial Attached SCSI) standards. Training sequence detection 80 may use algorithms or hardware circuitry to produce a detected training sequence from the digitized waveform record. Equalization adaptation (EQ) 82 may use algorithms or hardware circuitry to generate equalizer taps for the receiver 16 using the digitized waveform record and the detected training sequence. Equalizer adaptation 82 has a much better chance of succeeding when the training sequence is detected and becomes available. This solution is targeted to the real-time oscilloscopes, but the concept of this solution can be applied to sampling oscilloscopes as well.

Figure 7:
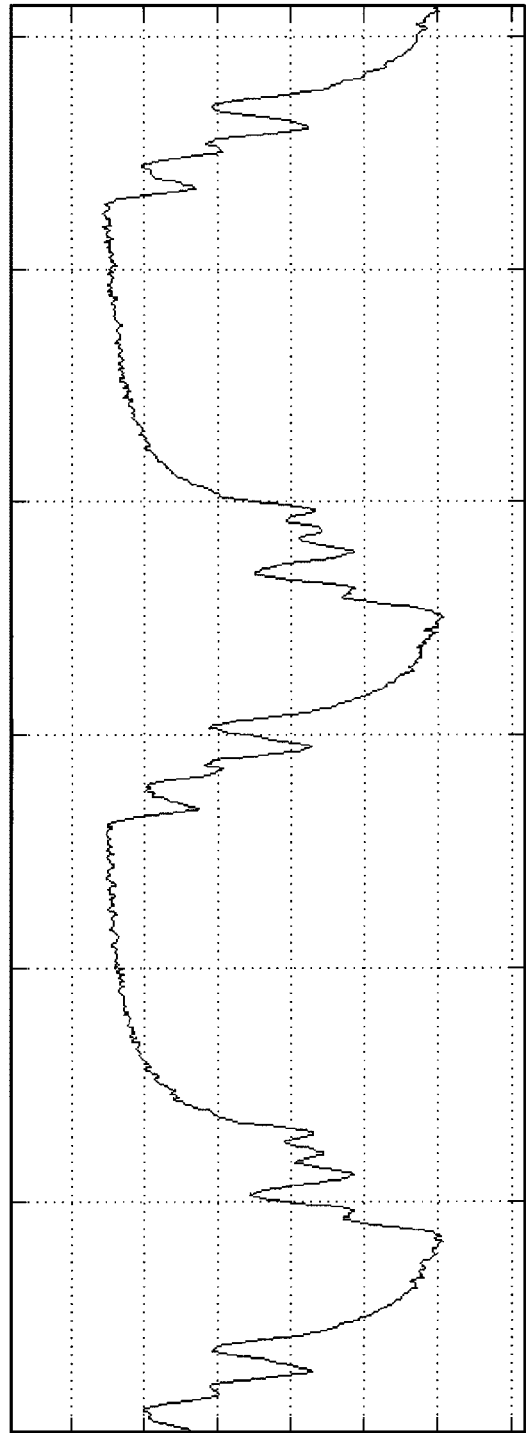
FIG. 7 shows an example of a waveform signal having large ISI at the receiver of a high speed serial data link system.

The detection of the training sequence 80 shown in FIG. 6 takes the digitized waveform record as input and outputs a detected training bit sequence. When the channel is very lossy, the digitized waveform record acquired at the receiver end of channel 14 is substantially degraded such that its bit sequence doesn't appear apparent. The waveform generated using the digitized waveform record shown in FIG. 7 is an example of a signal at the receiver end of the channel 14 having large ISI. If the bit sequence can be detected, then the equalization adaptation 82 can use the training bit sequence with the effects of the channel degradation being substantially reduced.

One method to detect the training sequence is to provide an input signal processor to remove channel effects of channel 14 prior to sequence detection. The input signal processor may be a de-embed filter 84 that characterizes the channel 14 as is shown in FIG. 8. The channel 14 may be characterized using S- or T-parameters of the channel 14 and the de-embed filter is generated based on the channel characteristics. The digitized waveform record is de-embedded 84 using the de-embed filter to remove the effect of the channel so that the training sequence can be easily identified. The de-embedded digitized waveform record is provided to a sequence detector 86 that detects the training sequence. This method works the best when large ISI is introduced by the channel.

Another input signal processor is a detection equalizer 88 that generates an equalized digitized waveform record. The sequence detector 86 receives the equalized digitized waveform record and outputs a detected training sequence as is represented by FIG. 9. This method assumes no knowledge of the channel 14 characteristics. The detection equalizer 88 employs a Feed Forward Equalizer (FFE), a Decision Feedback equalizer (DFE), a Continuous-Time Linear Equalizer (CTLE) or the like for producing an equalized waveform output. The freedom of using various combinations of FFE, DFE or CTLE for detection equalization 88 can significantly improve the chances of detecting the bit sequence reliably. It is important to note that the detection equalizer 88 is part of the detection of the training sequence 80 of FIG. 6 and not the equalizer in the EQ adaptation block 82. For example, SAS-2 6 G standard calls for 3-tap DFE as the receiver equalizer, which defines the output taps of the EQ adaptation block 82. But the detection equalizer 88 shown in FIG. 9 can have a multi-tap FFE/DFE, which has better capability to compensate the channel allowing the pattern sequence can be detected correctly. FIG. 10 shows the waveform equalized with a multi-tap FFE, from which the sequence is reliably detected.

Optional methods may exist for detecting training sequence if the test setup allows. One option is to use an analog waveform signal having a lower bit rate. Some transmitter chips 12 may be switchable, such as from 6 Gb/s to 3 Gb/s. On the same lossy channel 14, it is usually much easier to detect the training sequence from a 3 Gb/s analog waveform signal than to detect the same training sequence from a 6 Gb/s analog waveform signal. The analog waveform signal is sampled by the oscilloscope at the lower bit rate and a digitized waveform record is generated. The digitized waveform record at the lower bit rate is used for detecting the training sequence. The transmitter chip 12 is switched to the higher bit rate and another digitized waveform record of the analog waveform signal is acquired. The higher bit rate digitized waveform record is applied to the equalization adaptation 82 to generate a recovered clock and a re-sampled digitized waveform record.

Another option is to probe the analog waveform signal at the transmitter end of the serial data link system 10 where the training sequence is often easier to detect. The measurement probe 44 is connected to the transmitter end 12 of the channel 14 and samples of the analog waveform signal are acquired by the oscilloscope to generate a digitized waveform record. The digitized waveform record of the analog waveform signal acquired at the transmitter is used for detecting the training sequence. The measurement probe 44 is connected to the receiver end 16 of the channel 14 and samples of the analog waveform signal are acquired by the oscilloscope to generate another digitized waveform record. The digitized waveform record acquired at the receiver end 16 of the channel 14 is applied to the equalization adaptation algorithms or hardware circuits 82 to generate a recovered clock and a re-sampled digitized waveform record.

Figure 11:
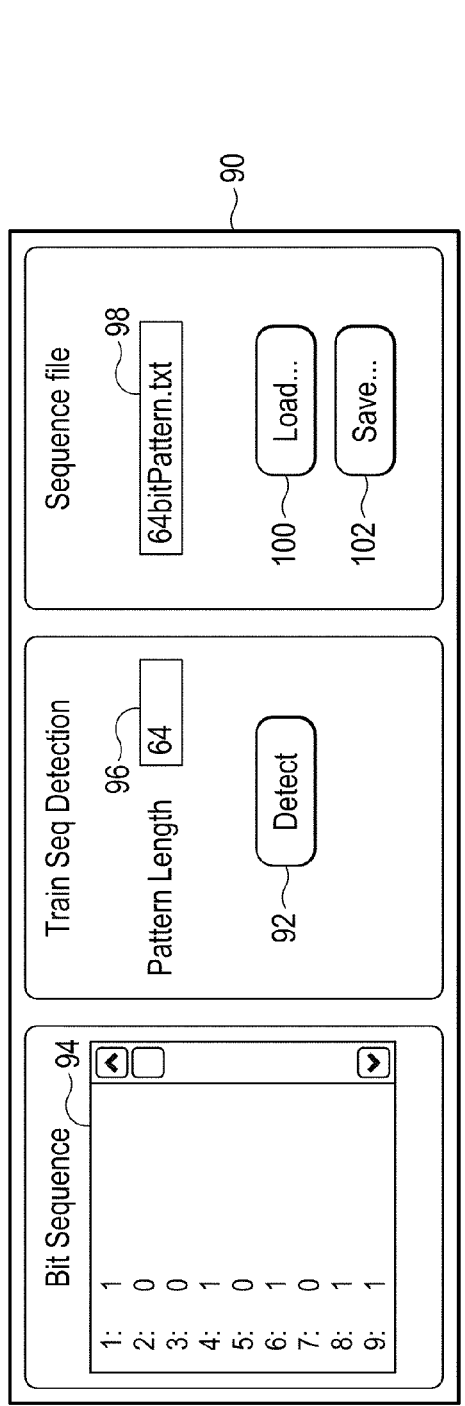
FIG. 11 illustrates a user interface for activating the training sequence detection and saving the training sequence according to the present invention.

The digitized waveform record is processed for detection of the training sequence 80 using one or a combination of the above described methods and produces a detected training sequence. Sequence detection processes are well known in the art and need not to be described here. The detected training sequence can be saved for future use. A user interface 90 for activating the training sequence detection and saving the detected training sequence is shown in FIG. 11. A detect icon 92 is displayed on the interface 90 which when clicked with a mouse or touched with a finger activates detection algorithms for detecting the training sequence. The detected bit sequence is displayed in box 94 with the pattern length shown in display box 96. A file name box 98 is provided where a user enters a file name for the detected training sequence. A load icon 100 is clicked or touched that loads the detected training sequence into a file having the user defined file name. A save icon 102 is clicked or touched to save the training sequence file in the memory 70 of the oscilloscope 40.

Figure 12:
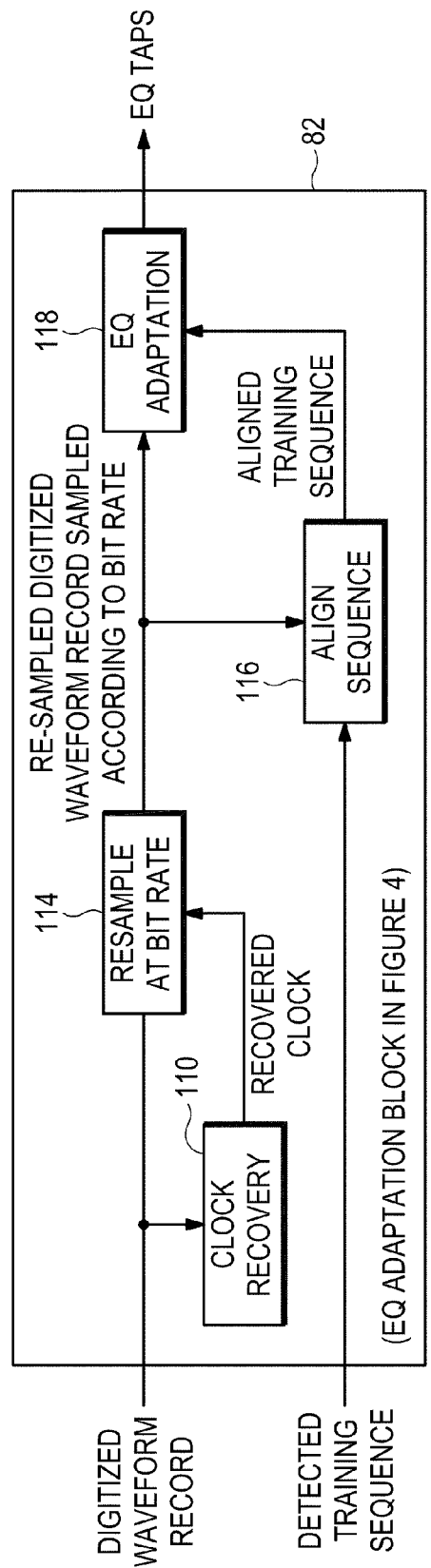
FIG. 12 illustrates the procedures for equalizer adaptation according to the present invention.
Figure 13:
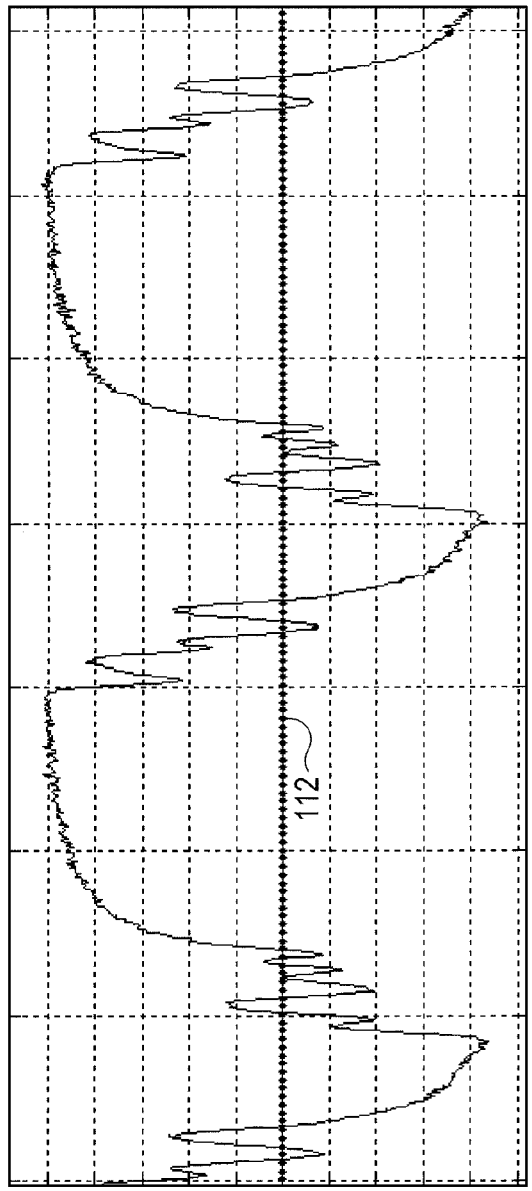
FIG. 13 shows a recovered clock in relation to the sampled analog waveform according to the present invention.

After the training sequence is detected and becomes available, equalizer adaptation algorithms or hardware circuits 82 can use the training sequence to adapt the DFE taps of the SAS-2 6 G equalizer standard or taps of other equalizers, such as FFE, on the waveform generated using the digitized waveform record, as shown in FIG. 7. Equalizer adaptation algorithms or hardware circuitry 82 in FIG. 6 are shown in greater detail in the FIG. 12. The equalization adaptation algorithms or hardware circuits 82 initially recovers the clock 110 in the digitized waveform record. A clock recovery algorithm may be implemented in the oscilloscope 40, such as a clock recovery based on the non-linear spectral line technique. The software clock recovery can be designed to emulate various phase lock loops (PPLs). FIG. 13 shows the recovered clock 112 (dots) along with the waveform shown in FIG. 7. The distance between the clock recovery dots represents the clock period or unit interval of the digitized waveform record.

The digitized waveform record signal is resampled 114 according to the signal bit rate. Real-time scopes usually sample at fixed sample rates that usually are not synchronized to the signal bit rates. As the recovered clock 112 becomes available, resampling the digitized waveform record can be done accurately since the digitized waveform record is band limited by the scopes.

Figure 14:
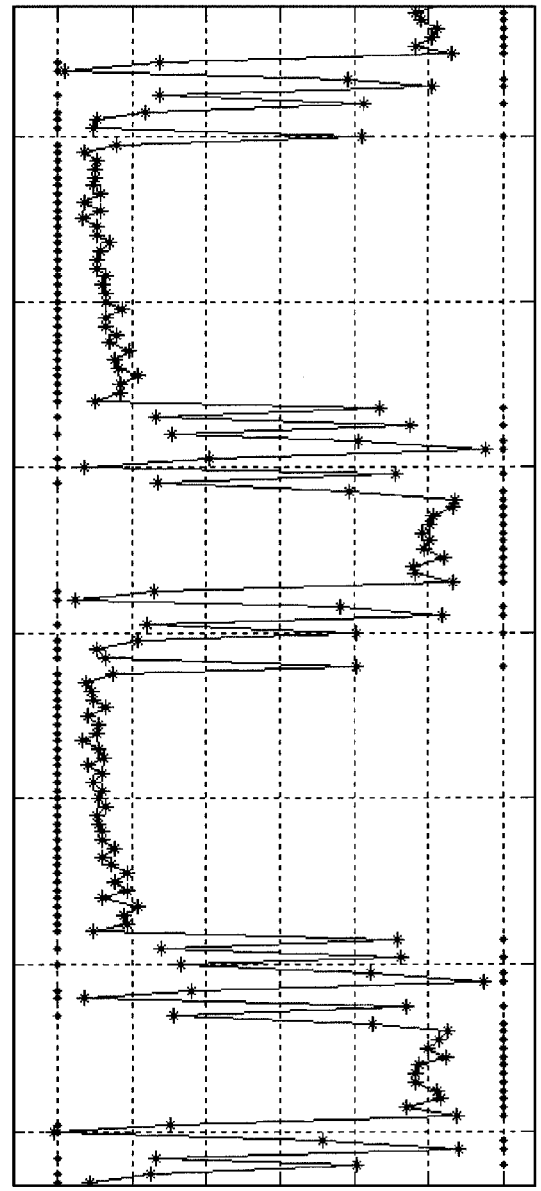
FIG. 14 shows the training sequence aligned with the properly de-emphasized sampled waveform signal according to the present invention.

General equalization adaptation algorithms using training sequences require that the incoming digitized samples of the analog waveform signal are aligned with the training sequence. Cross correlation is the most common method to align the digitized samples and the training sequence 116. However, when the analog waveform signal suffers significant ISI introduced by channel loss, such as the waveform shown in FIG. 13, directly computing cross correlation between the digitized samples of the digitized waveform record at bit center and training sequence does not yield robust sequence alignment. De-emphasis is added to the re-sampled digitized waveform record to improve the robustness of sequence alignment. De-emphasis is added on the digitized samples of the waveform record at bit center with the proper de-emphasis value based on the following criteria: 1) the transition density of the de-emphasized digitized waveform record should approximate the transition density of the training sequence; and 2) the de-emphasis value that provides the less mean square error is better. After the proper de-emphasis level is determined according to the above criteria, the re-sampled, de-emphasized digital samples of the digitized waveform record is cross correlated with the aligned training sequence to find the peak for determining the correct alignment. FIG. 14 shows the training sequence aligned with the re-sampled digital samples of the digitized waveform record that has been properly de-emphasized. The de-emphasized digitized waveform samples (stars) have good correlation with the aligned training bit sequence (dots).

Figure 15:
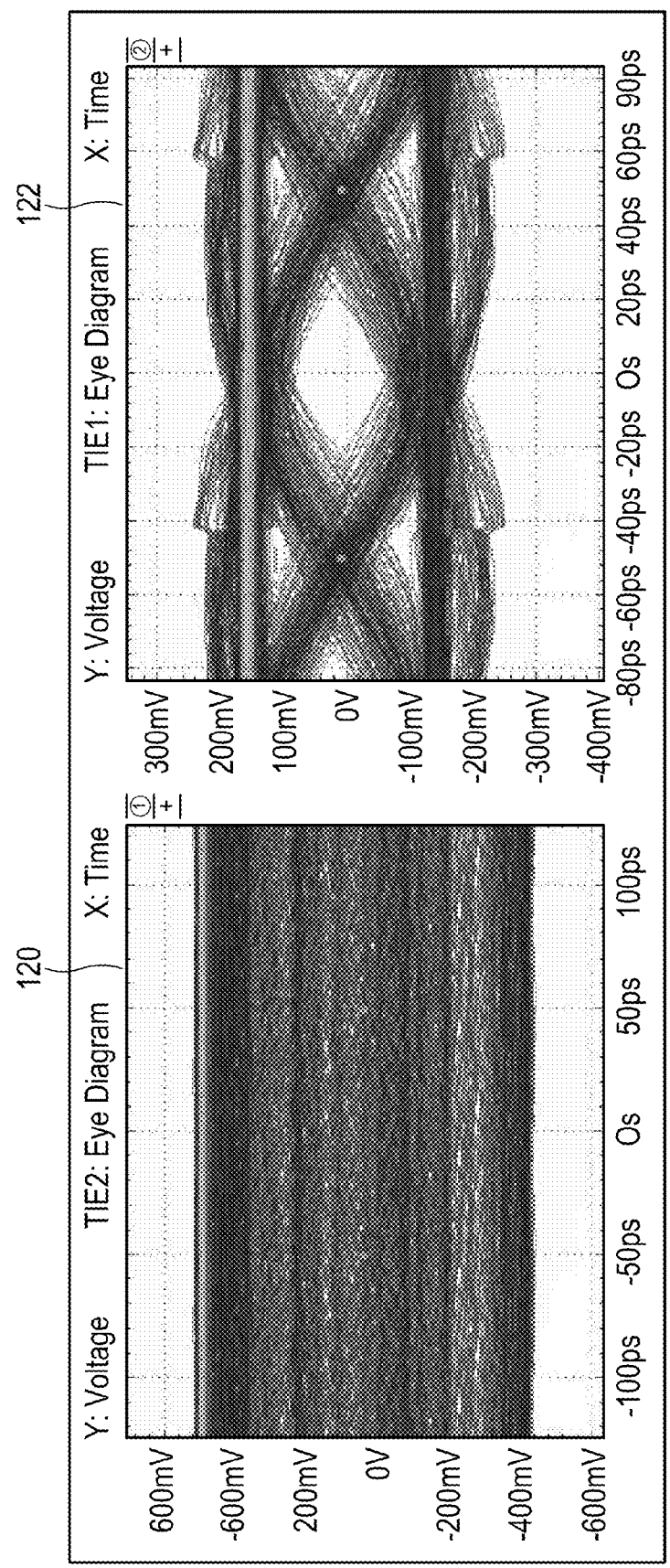
FIG. 15 shows the closed sampled analog signal eye diagram before equalization and the open sampled analog signal eye diagram after equalization.

After the training sequence has been aligned with the incoming re-sampled digital samples of the digitized waveform record, standard equalization adaptation algorithms 118, such as Least Mean Square (LMS) algorithm, can be executed to optimize the equalizer taps, such as the 3-tap DFE equalizer defined in the proposed SAS-2 6 G standard. After equalizer adaptation 82 is completed, the oscilloscope 40 can equalize the acquired digital waveform record using the adapted taps in a DFE equalizer. FIG. 15 shows the eye diagram 120 of the digitized waveform record shown in FIG. 7, which is closed, and the eye diagram 122 opened by the equalizer using the optimized taps. The coefficients of the equalizer taps for the DFE equalizer defined in the proposed SAS-2 6 G standard may be stored in the oscilloscope 40 and used in the design of DFE equalizers.

A training sequence detection procedure using the real-time scopes has been described. The procedure uses the information about channel, or uses flexible equalization scheme, or uses available test setup to detect a training sequence even the sequence is difficult to recognize without special data processing. An equalization adaptation procedure is then introduced that uses the detected training sequence, and uses a de-emphasis technique to help sequence alignment. These two procedures enable the real-time scopes handle more equalization challenges.

It will be obvious to those having skill in the art that many changes may be made to the details of the above-described embodiments of this invention without departing from the underlying principles thereof. For example, the present invention may be implemented as algorithms operating under microprocessor control in an oscilloscope. However, the present invention may be implemented completely, or in part using hardware circuitry performing the operations described hereinabove in conjunction with algorithms. The scope of the present invention should, therefore, be determined only by the following claims.

What is claimed is:

1. An equalization simulator with training sequence detection for use in an oscilloscope generating a digitized waveform record from acquiring samples of an analog waveform signal from a serial data link comprising:

an input signal processor receiving the digitized waveform record and producing a processed digitized waveform record having channel effects of the serial data link removed;

a sequence detector receiving the processed digitized waveform record and generating a training sequence;

an equalization adapter receiving the digitized waveform record and the training sequence with the equalization adapter having means for recovering a clock from the received digitized waveform record having a clock rate equal to the bit rate of the analog waveform signal, a re-sampler receiving the digitized waveform record and the recovered clock and generating a re-sampled digitized waveform record according the sampling bit rate of the analog waveform signal using the recovered clock signal, means for aligning the re-sampled digitized waveform record with the received training sequence to generate an training sequence aligned with the re-sampled digitized waveform record, and means for receiving the re-sampled analog waveform and the aligned training sequence and generating equalizer taps; and an equalizer receiving the equalizer taps and the digitized waveform record and generating an equalized digitized waveform record.

2. The equalization simulator with training sequence detection for use in an oscilloscope as recited in claim 1 wherein the input signal processor comprising a de-embed filter representing channel characteristics of the serial data link receiving the digitized waveform record and generating a de-embedded processed digitized waveform record applied to the sequence detector.

3. The equalization simulator with training sequence detection for use in an oscilloscope as recited in claim 1 wherein the input signal processor comprising a detection equalizer receiving the digitized waveform record and generating an equalized processed digitized waveform record applied to the sequence detector.

4. A method of equalization simulation using an oscilloscope comprising the steps of:

a) acquiring samples of an analog waveform signal for a digitized waveform record using the oscilloscope;

b) detecting a training sequence from the digitized waveform record;

c) recovering a clock signal from the digitized waveform record having a clock rate equal to the bit rate of the analog waveform signal;

d) re-sampling the digitized waveform record according the bit rate of the analog waveform signal using the recovered clock signal;

e) applying de-emphasis on the center of the bits in the re-sampled digitized waveform record;

f) aligning the detected training sequence with the de-emphasized re-sampled digitized waveform record;

g) generating equalizer taps using the re-sampled digitized waveform record and the aligned training sequence; and h) equalizing the digitized waveform record using the generated equalizer taps in an equalizer.

5. The method of equalization simulation using an oscilloscope as recited in claim 4 wherein the training sequence detecting step comprises the steps of:

a) generating a channel de-embed filter as a function of the channel characteristics; and b) generating a de-embedded digitized waveform record for detecting the training sequence by applying the digitized waveform record to the de-embed filter.

6. The method of equalization simulation using an oscilloscope as recited in claim 4 wherein the training sequence detecting step comprises the step of generating an equalized digitized waveform record for detecting the training sequence using a multi-tap equalizer.

7. The method of equalization simulation using an oscilloscope as recited in claim 4 wherein the detecting the training sequence step comprises the steps of:

a) decreasing the bit rate of the analog waveform signal;

b) acquiring samples of the decreased bit rate analog waveform signal using the oscilloscope to generate a digitized waveform record for detecting the training sequence;

c) increasing the bit rate of the analog waveform signal; and d) acquiring samples of the increased bit rate analog waveform signal using the oscilloscope to generate another digitized waveform record for recovering the clock signal and re-sampling the other digitized waveform record.

8. The method of equalization simulation using an oscilloscope as recited in claim 4 wherein the detecting the training sequence step comprises the steps of:

a) connecting a measurement probe at a transmitter end of a channel;

b) acquiring samples of the analog waveform signal at the transmitter end of the channel using the oscilloscope to generate a digitized waveform record for detecting the training sequence;

c) connecting the measurement probe at a receiver end of the channel; and d) acquiring samples of the analog waveform signal at the receiver end of the channel using the oscilloscope to generate another digitized waveform record for recovering the clock signal and re-sampling the other digitized waveform record.

9. The method of equalization simulation using an oscilloscope as recited in claim 4 wherein the de-emphasis applying step comprising the step of defining a de-emphasis value as a function of transition density of the de-emphasized re-sampled digitized waveform record being approximate to the transition density of the detected training sequence and providing a minimal mean square error.

10. The method of equalization simulation using an oscilloscope as recited in claim 4 wherein the aligning step further comprises the step of cross correlating the detected training sequence with the de-emphasized re-sampled digitized waveform record to find a peak value to determine the correct alignment.

* * * * *